(12) United States Patent
Hayakawa

(10) Patent No.: US 7,214,084 B2
(45) Date of Patent: May 8, 2007

(54) SOCKET FOR ELECTRICAL PARTS

(75) Inventor: Kenji Hayakawa, Saitama (JP)

(73) Assignee: Enplas Corporation, Saitama (JP)

( * ) Notice: Subject to any disclaimer, the term of this patent is extended or adjusted under 35 U.S.C. 154(b) by 0 days.

(21) Appl. No.: 11/258,006

(22) Filed: Oct. 26, 2005

(65) Prior Publication Data
US 2006/0094278 A1    May 4, 2006

(30) Foreign Application Priority Data
Oct. 29, 2004    (JP)    ............................. 2004-315343

(51) Int. Cl.
*H01R 13/62*    (2006.01)

(52) U.S. Cl. .................................... 439/331; 439/268

(58) Field of Classification Search ............... 439/331, 439/268, 70
See application file for complete search history.

(56) References Cited

U.S. PATENT DOCUMENTS

| | | | |
|---|---|---|---|
| 6,296,505 B1 * | 10/2001 | Fukunaga et al. ........... | 439/268 |
| 6,929,486 B2 * | 8/2005 | Shimada ...................... | 439/70 |
| 6,957,965 B2 * | 10/2005 | Huang et al. ................ | 439/70 |
| 6,984,142 B2 * | 1/2006 | Shimizu ...................... | 439/268 |
| 2002/0106925 A1 * | 8/2002 | Yamagishi ................... | 439/331 |
| 2003/0109163 A1 * | 6/2003 | Shimada ...................... | 439/331 |
| 2003/0114034 A1 * | 6/2003 | Sano et al. .................. | 439/331 |
| 2003/0171021 A1 * | 9/2003 | Okamoto ..................... | 439/331 |
| 2003/0190831 A1 * | 10/2003 | Hachuda ...................... | 439/331 |

FOREIGN PATENT DOCUMENTS

JP        2002-8809        1/2002

* cited by examiner

*Primary Examiner*—Tulsidas C. Patel
*Assistant Examiner*—Vladimir Imas
(74) *Attorney, Agent, or Firm*—Staas & Halsey LLP

(57) ABSTRACT

A socket for an electrical part includes a socket body to which an electrical part is accommodated, the socket body having a base portion to which a number of elastic contact pins are arranged, a movable member disposed to the socket body above the base portion to be vertically movable, contact portions, between which a terminal of the electric part is inserted, formed to the contact pins being opened or closed, and a latch member provided for the socket body so as to press the electrical part accommodated to the socket body. The latch member is disposed to be movable between a first position at which the electrical part is pressed and a second position at which the latch member is retired from a line along which the electrical part is accommodated or taken out. The latch member is moved by a pressing portion formed to the movable member.

8 Claims, 18 Drawing Sheets

1

SOCKET FOR ELECTRICAL PARTS

BACKGROUND OF THE INVENTION

1. Field of The Invention

The present invention relates to a socket for an electrical part for detachably holding an electrical part such as a semiconductor device (called as "IC package" hereinlater).

2. Related Art

In a known art, there has been provided an IC socket, as "socket for an electrical part" for detachably holding an "IC package" as an electrical part such as disclosed in Japanese Laid-Open (KOKAI) Patent Publication No. 2002-8809.

The IC package disclosed in this publication includes a number of solder balls, as terminals, which are arranged on a lower surface of the IC package so as to protrude therefrom in an lattice arrangement including vertical rows Y and horizontal lines X.

The IC socket, on the other hand, includes a socket body in which the IC package is accommodated and which is provided with a number of contact pins contacting the terminals of the IC package. The socket body is also provided with a movable (moving) member vertically movable to elastically deform the contact pins so as to be contacted or separated to or from the terminals of the IC package.

The socket body is further provided with a lever member to vertically move the movable member to be rotatable through a rotation shaft, i.e., pivot, and an operation member for rotating or pivoting the lever member is also provided to the socket body to be vertically movable.

By vertically moving the operation member, the lever member is rotated and, hence, the movable member is vertically moved, thus elastically deforming the contact pins, and accordingly, contact portions of the contact pins are contacted to or separated from the terminals of the IC package, respectively.

Furthermore, the socket body is provided with a latch member to be rotatable or pivotal, and by moving downward the operation member, an operating portion of the operation member pushes the latch member to rotate the same, and thereby, the latch member is retired from the IC package accommodation or take-out line.

However, in the conventional structure of the IC socket mentioned above, there is adopted a structure for rotating the latch member by the operation member which vertically moves the movable member. For this reason, it is essential to locate such operation member, and in addition, it is difficult to make coincident timings of the open/close operation of the contact pins and rotating operation of the latch member. That is, the open/close operation of the contact pins is performed by the movement of the movable member, and on the other hand, the rotating operation of the latch member is performed by the operation member which operates the movable member, so that the contact pins and the latch member are operated by different members. Thus, it is difficult to make coincident the timings of the open/close operation of the contact pins and rotating operation of the latch member.

SUMMARY OF THE INVENTION

Therefore an object of the present invention is to substantially eliminate defects or drawbacks encountered in the prior art mentioned above and to provide a socket for an electrical part in which timings of open/close operation of contact pins and rotating operation of a latch member can accord easily with each other.

Another object of the present invention is to provide a socket for an electrical part having a reduced number of members or parts such as an operation member.

These and other objects can be achieved according to the present invention by providing a socket for an electrical part, which comprises: a socket body to which an electrical part is accommodated, the socket body having a base portion to which a plurality of elastic contact pins, which are contacted to or separated from terminals of the electrical part, are arranged; a movable member disposed to the socket body above the base portion thereof to be vertically movable, deformation of elastic pieces of the contact pins inserted into insertion holes formed to the movable member being performed in accordance with the vertical movement of the movable member, according to the deformation thereof, contact portions formed to the contact pins being opened or closed; and a latch member provided for the socket body so as to press the electrical part accommodated to the socket body, the latch member being disposed to be movable between a first position at which the electrical part is pressed and a second position at which the latch member is retired from a line along which the electrical part is accommodated or taken out, the movable member being provided with a pressing portion pressing and moving the latch member to the second position when the movable member is lowered.

The latch member is rotatable around a rotation shaft of the socket body and formed with a portion to be pressed by the pressing portion formed to the movable member.

According to the socket for an electrical part of the present invention of the characters mentioned above, by vertically moving the movable member, the opening/closing operation of the contact pins and the rotating operation of the latch member can be done directly. Therefore, it may be possible to eliminate an operation member, and the movable member may be pressed by a head disposed on a package insertion/take-out side device, not shown, thus reducing the number of members or parts to be located.

In addition, since the opening/closing operation of the contact pins and the rotating operation of the latch member are performed by the vertical movement of the movable member, there is less influenced by errors in molding or assembling the members, and the timings of these operations can be easily made coincident with each other.

The nature and further characteristic features of the present invention will be made more clear from the following descriptions made with reference to the accompanying drawings.

BRIEF DESCRIPTION OF THE DRAWINGS

In the accompanying drawings:

FIG. 8 shows the contact pin of the IC socket of the fist embodiment, in which

DESCRIPTION OF THE PREFERRED EMBODIMENTS

Figure 1:
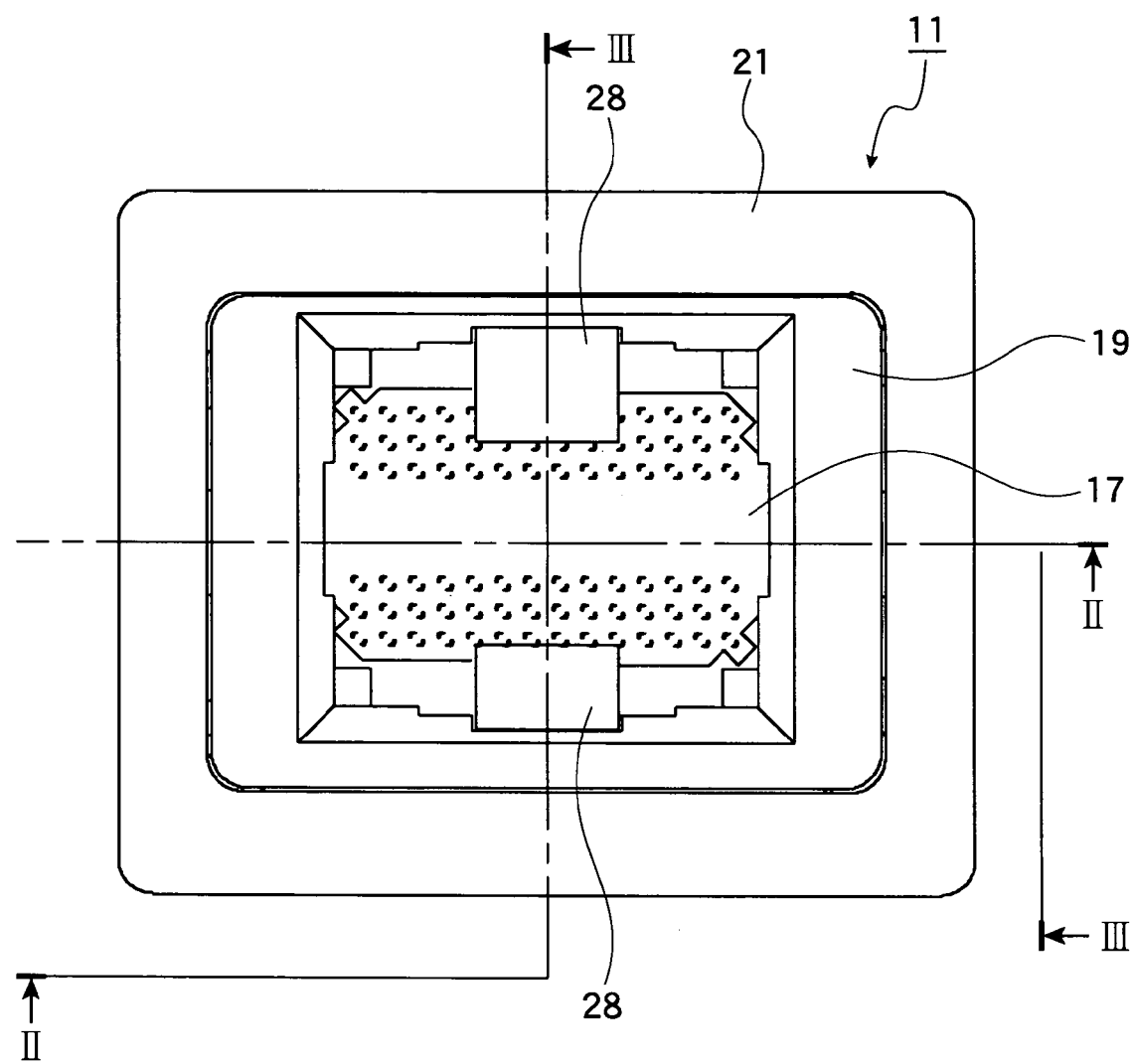
FIG. 1 is a plan view of an IC socket according to a first embodiment of the present invention.

Preferred embodiments of the present invention will be described hereunder with reference to the accompanying drawings.

[First Embodiment]

FIGS. 1 to 14 represent a first embodiment of an IC socket as a socket of an electrical part. Further, it is first to be noted that terms "right", "left", "upper", "lower" and the like terms are used herein with reference to the illustrated state on the drawings or in a generally using state of the IC socket of this kind.

With reference to FIGS. 1 to 14, reference numeral 11 denotes an IC socket as "a socket for an electrical part", which is a socket for establishing an electrical connection between a solder ball 12b as a terminal of an IC package 12 as "an electrical part" and a printed circuit board, not shown, of a measuring device such as tester, for carrying out a performance test of the IC package 12.

Figure 6:
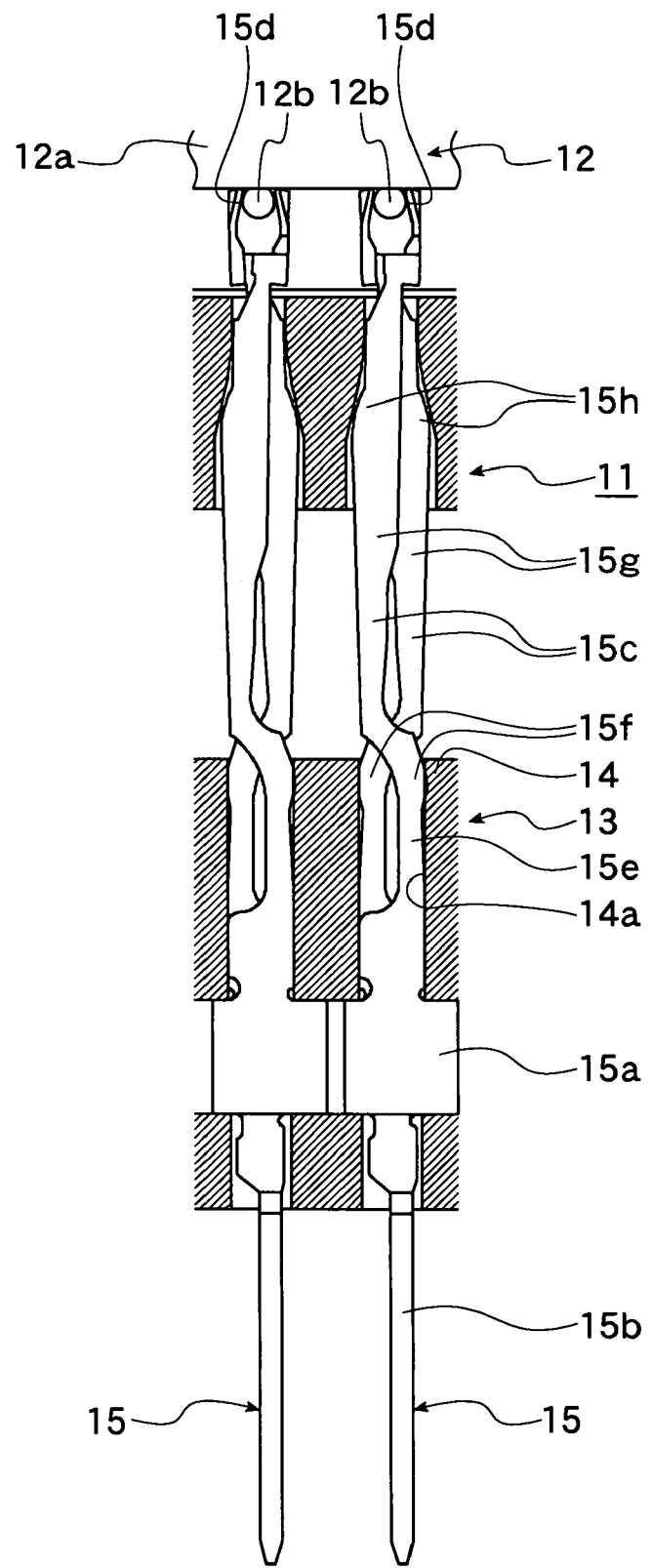
FIG. 6 is a sectional view of a contact pin, in an enlarged scale, in a location when the movable member takes its uppermost position in the first embodiment.

The IC package 12 is so-called an BGA (Ball Grid Array) type, such as shown in FIGS. 6, in which terminals 12b, each in a spherical shape, are arranged to a lower surface of a square package body 12a of the IC package 12 so as to protrude therefrom in vertical lines and horizontal rows to provide a matrix.

Figure 2:
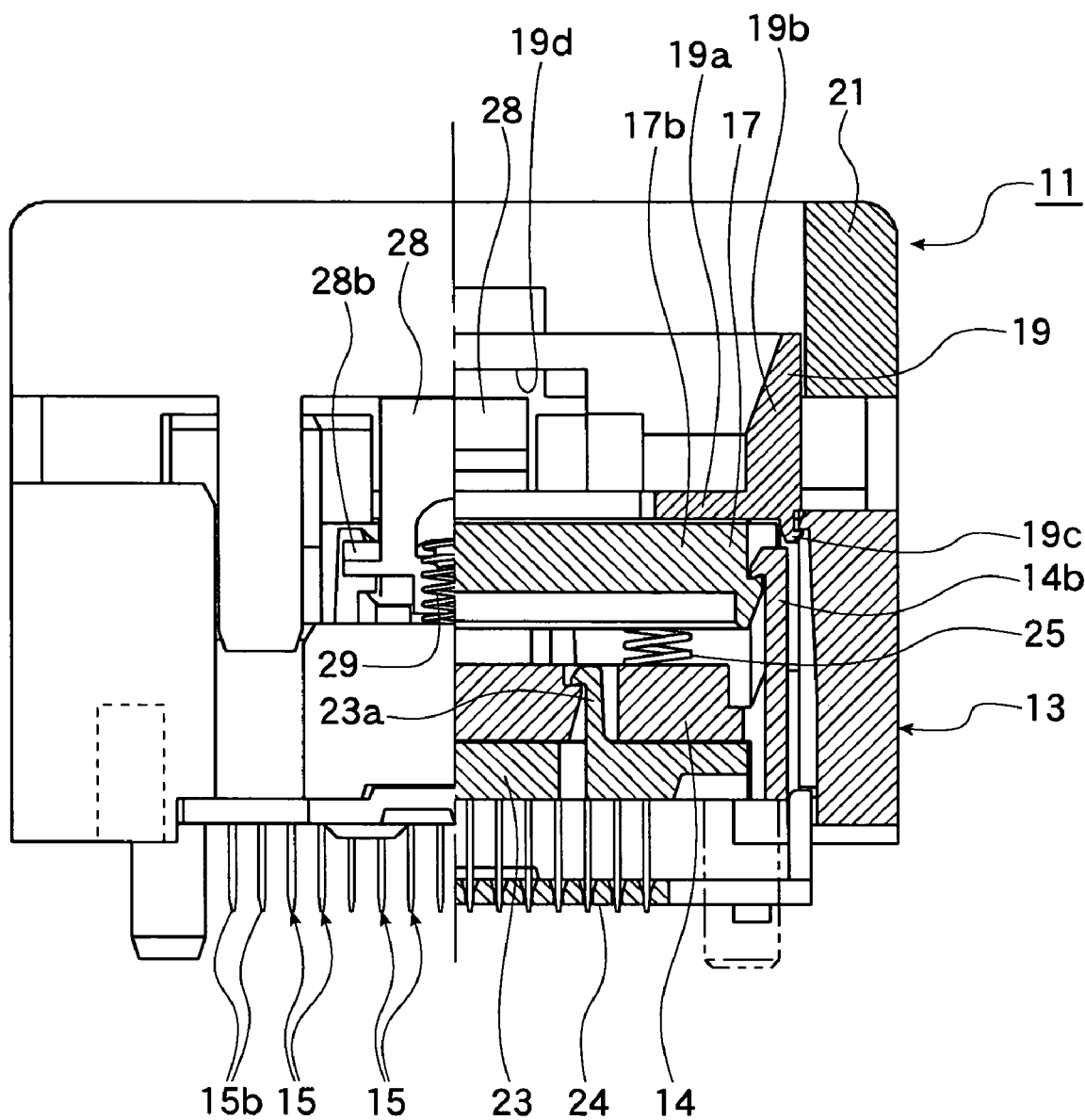
FIG. 2 is a sectional view taken along the line II—II in FIG. 1.

On the other hand, as shown in FIG. 2, the IC socket 11 has a socket body 13, made of synthetic resin, to be mounted on a printed circuit board, not shown, and this socket body 13 is provided with a number of contact pins 15 contacting to and separating from the solder balls 12b, respectively, of the IC package 12. The socket body 13 is also provided with a movable (moving) member 17 for displacing the contact pins 15, and a guide member 19 is fixed to the socket body on the upper side of the movable member 17. Furthermore, an operation (or operating) member 21 is also disposed to the socket body 13 so as to vertically move the movable member 17.

Figure 7:
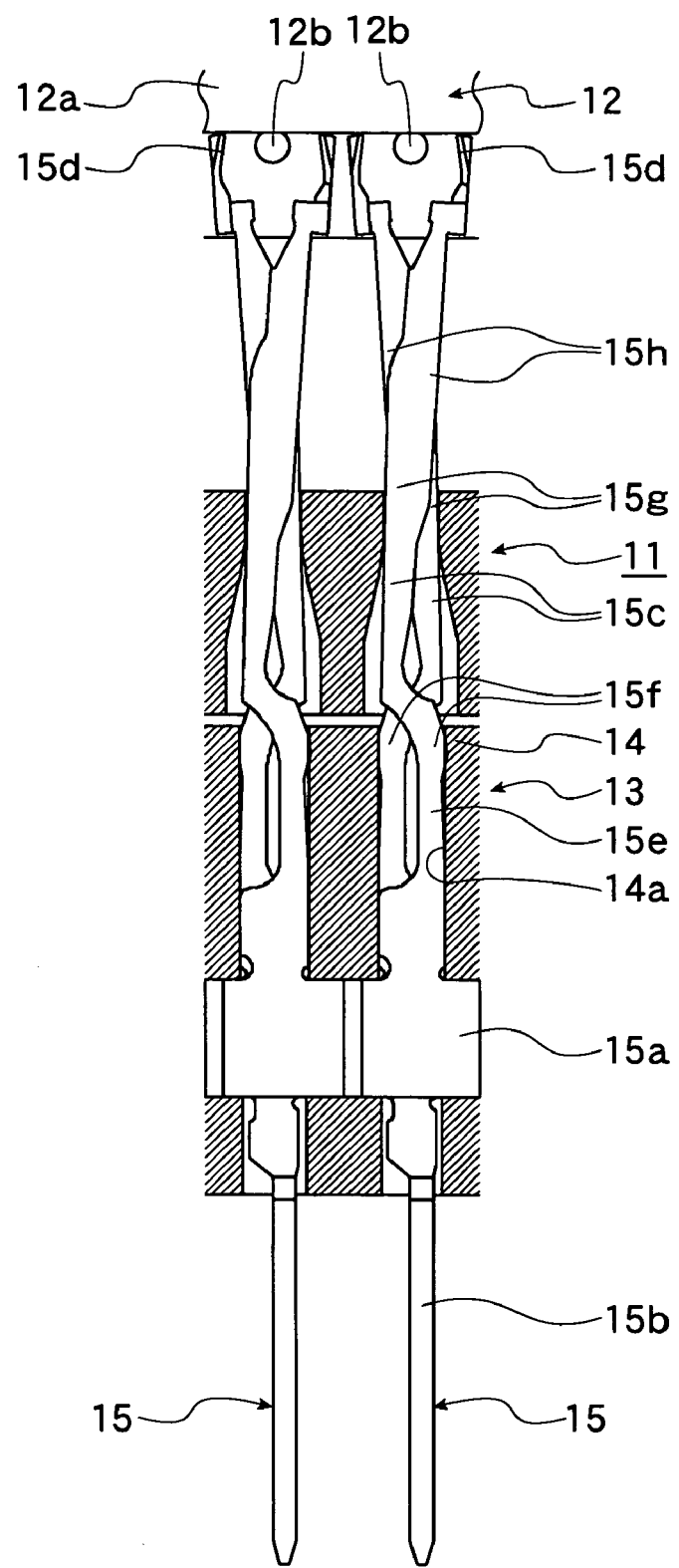
FIG. 7 is a sectional view of a contact pin, in an enlarged scale, in a location when the movable member takes its lowermost position in the first embodiment.
Figure 8A:
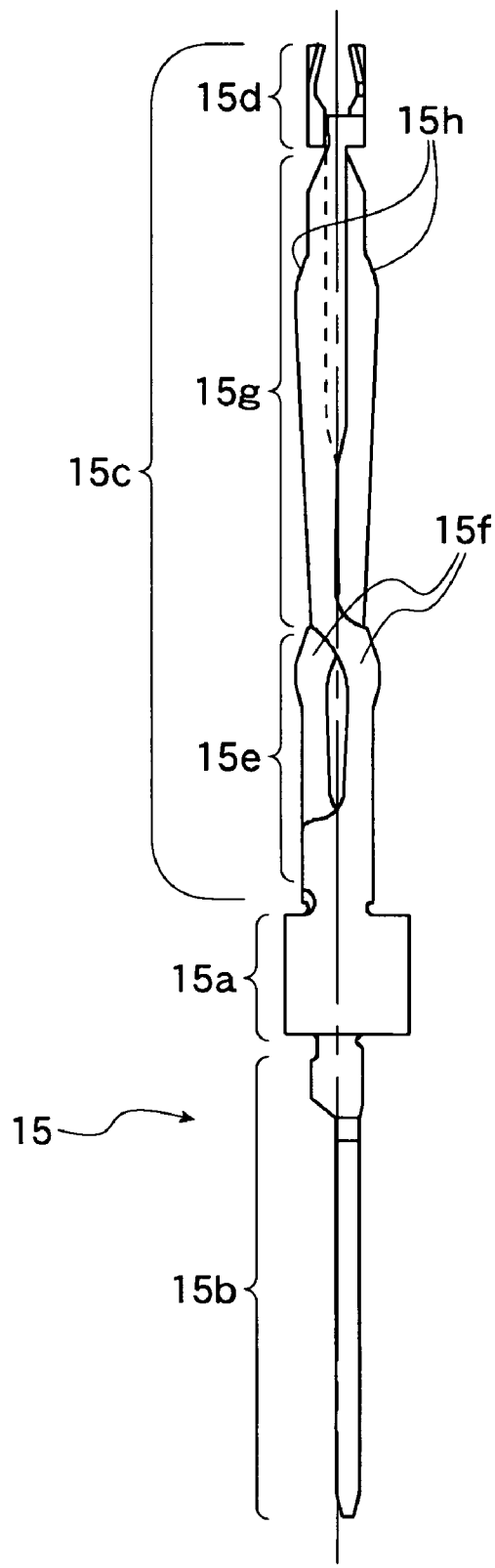
FIG. 8A is a front view of the contact pin and FIG. 8B is a right side view of FIG. 8A.
Figure 8B:
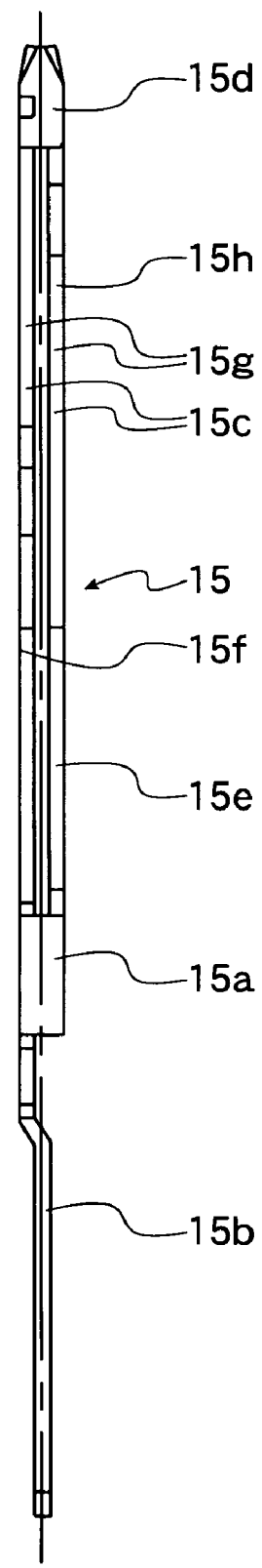

The contact pin 15 is formed from a plate member, rich in a springy property and electrical conductivity, through a pressing working in a shape as shown in FIGS. 6 to 8.

More specifically, the contact pin has a base portion 15a as stopper portion having U-shape in section at an intermediate portion of the contact pin 15 in its vertical direction and also has a solder tale portion 15b formed to the lower side of the base portion 15a and has a pair of elastic pieces 15c formed to the upper side of the base portion 15a.

The paired elastic pieces 15c have lower end sides commonly formed as the U-shaped base portion 15a, and accordingly, these elastic pieces face to face each other. The elastic pieces 15c have upper end sides (front free end side portions) to which contact portions 15d are formed so as to contact or separate from the side portion of the solder ball 12b, so that when the solder ball 12b is clamped between these contact portions 15d, the electrical connection can be established.

Furthermore, the paired elastic pieces 15c have lower portions 15e which are inserted into insertion hole 14a of a base member 14, and preloading projections 15f are formed to the upper sides of these lower portions 15e so as to project sideways. These preloading projections 15f abut against an inner wall of the insertion hole 14a to thereby be elastically deformed in a direction along which the contact portions 15d are closed and to apply the preload.

In addition, sliding or slidable portions 15g are formed to the upper sides of the lower portion 15e of the paired elastic pieces 15c so as to project in a direction opposite to the lower portion (15e) side. The slidable portions 15g project over the base member 14 and inserted into an insertion hole 17a of the movable member 17. When the movable member 17 moves vertically, the inner wall portions of the insertion hole 17a slide along the slidable portions 15g and, hence, the elastic pieces 15c are elastically deformed, thereby opening or closing the contact portions 15d.

The insertion hole 17a of the movable member 17 has a shape downward opened, as viewed such as shown in FIG. 6. Further, the slidable portions 15g are formed with bulged portions 15h, respectively, and when these bulged portions 15h are pushed, both the contact portions 15d are moved in opening direction as shown in FIG. 7.

Still furthermore, both the contact portions 15d project upward, as shown in FIG. 6, over the movable member 17 in its uppermost position, and are bent, at the upper end of the slidable portions 15g, at substantially right angle so as to face each other to thereby clamp the solder ball 12b between the contact pin 15 of the IC socket 11 and the solder ball 12b of the IC package 12 to establish the electrical connection therebetween.

Figure 4:
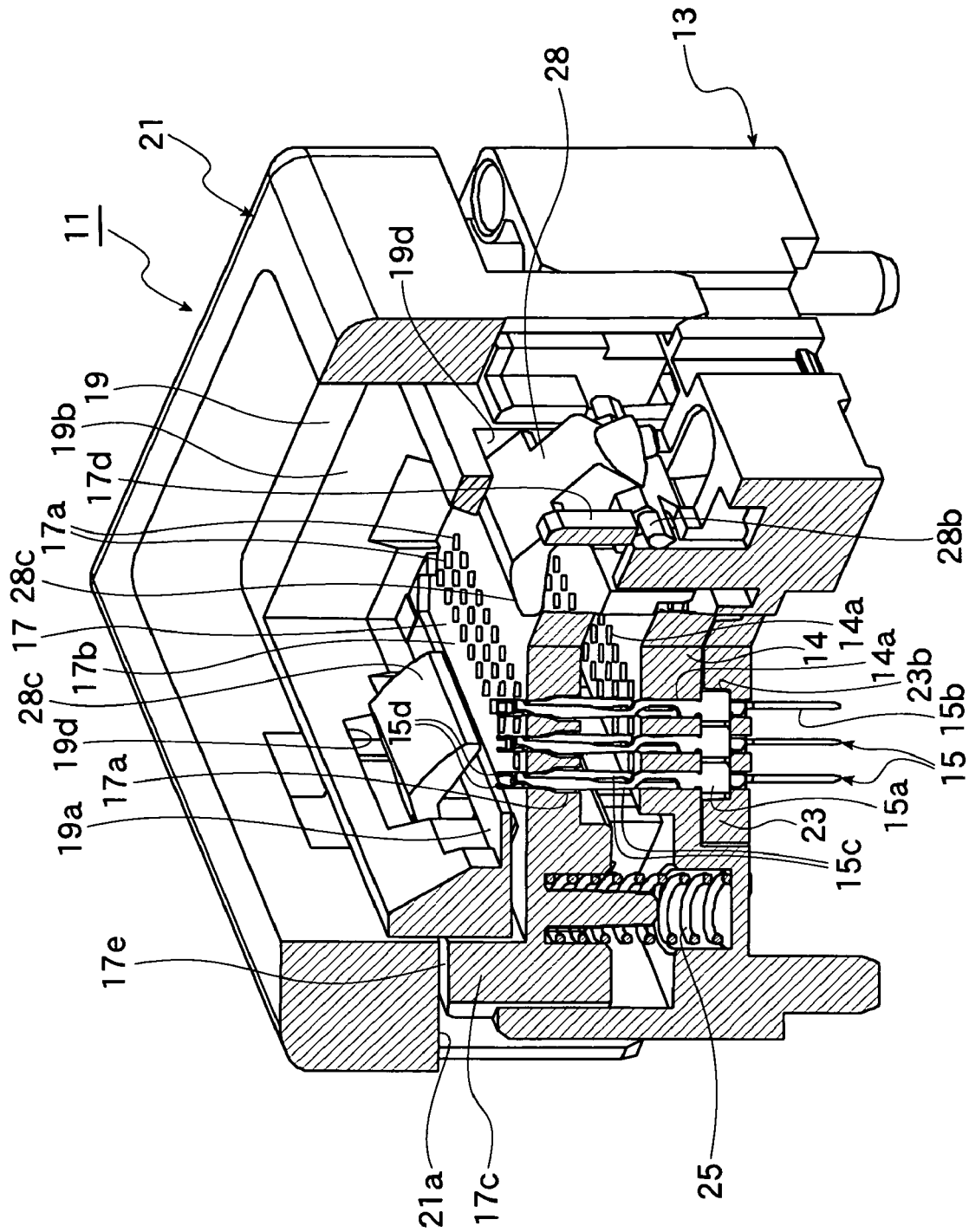
FIG. 4 is a perspective view, partially in section, of the IC socket of the first embodiment, in which a movable member takes an uppermost position thereof.

Further, as shown in FIG. 2, a bottom plate 23 is attached to a lower surface side of the base member 14 as "support member" by means of engaging piece 23a. The bottom plate 23 is formed with insertion holes 23a through which the solder tale portions 15b of the contact pins 15 are inserted as shown in FIGS. 4 and 6. The base portion 15a of the contact pin 15 is clamped between the bottom plate 23 and the base member 14 to thereby prevent the bottom plate from moving downward.

Figure 3:
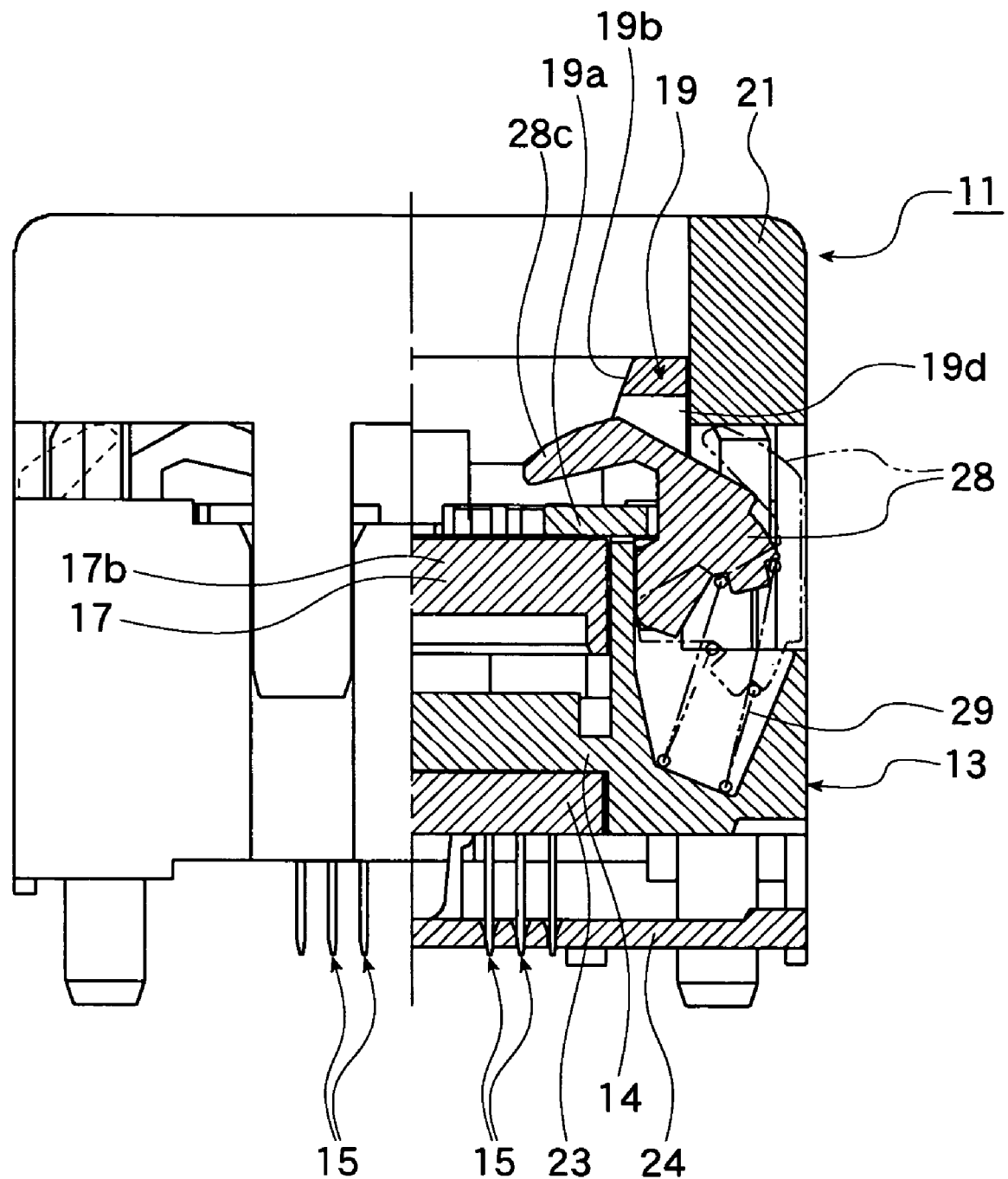
FIG. 3 is a sectional view taken along the line III—III in FIG. 1.

In addition, a location board 24 is disposed to the lower side of the bottom plate 23 to be vertically movable. Each of the solder tail portions 15b projecting downward from the bottom plate 23 further projects downward through the location board 24 as shown in FIG. 2 or 3, and then, is inserted into a through hole formed to a printed circuit board, not shown, and then soldered thereto, thus completing the connection.

According to such connection, a number of contact pins 15 are arranged into matrix as shown in FIG. 1 including a plurality of rows and lines.

Figure 9:
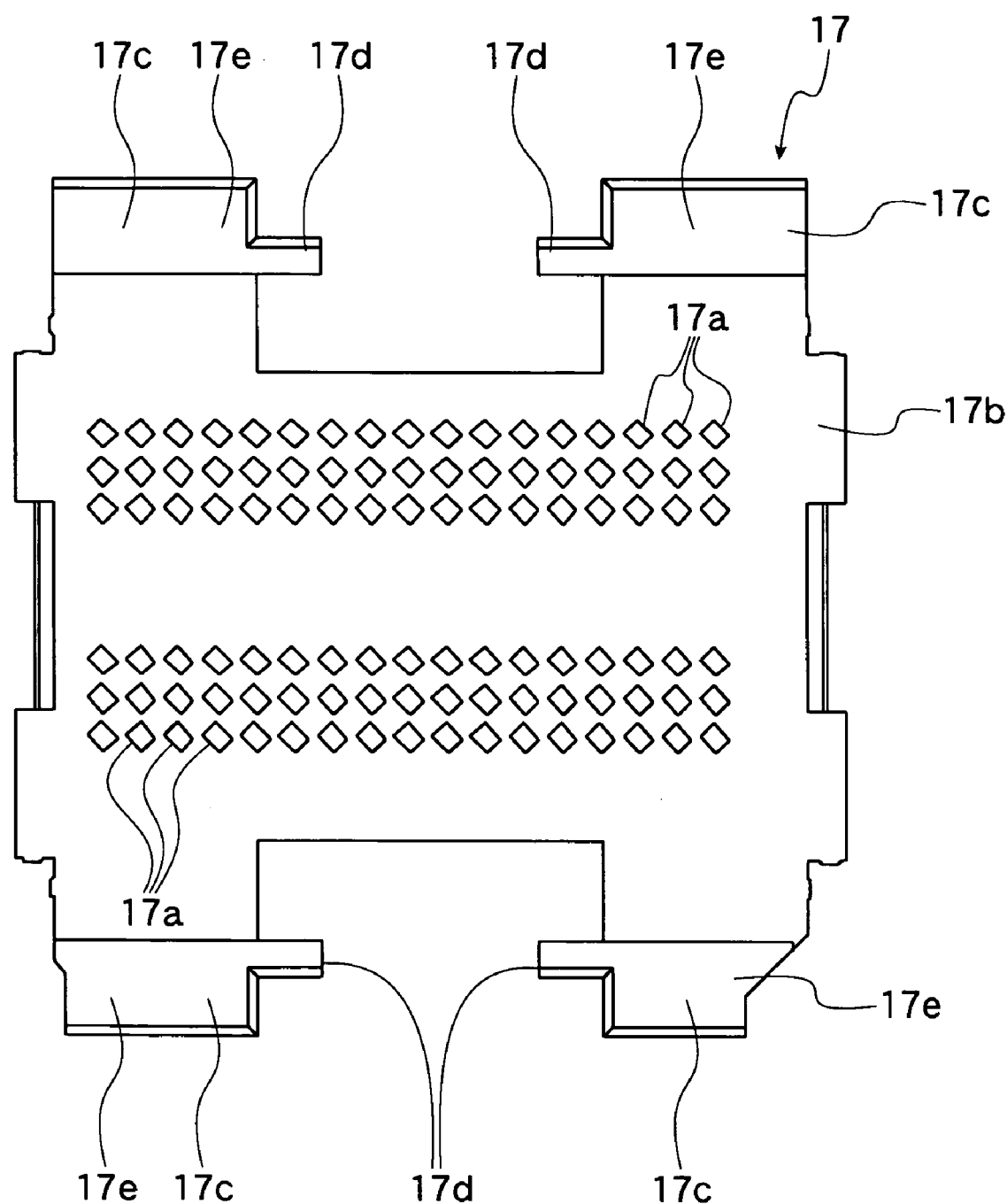
FIG. 9 is a schematic plan view of the movable member of the IC socket of the first embodiment of the present invention.
Figure 10:
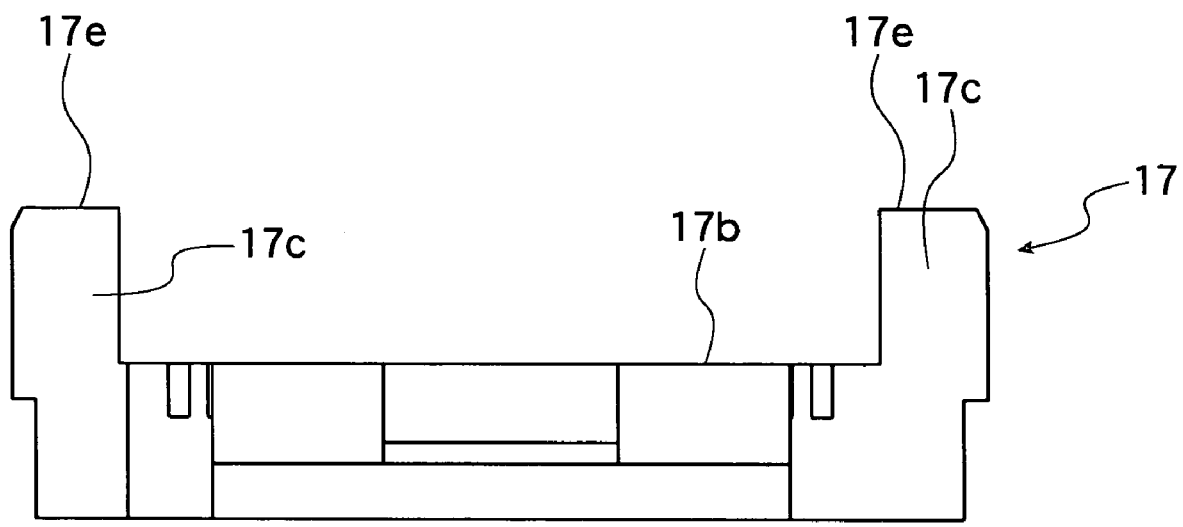
FIG. 10 is a right side view of the movable member of FIG. 9.
Figure 11:
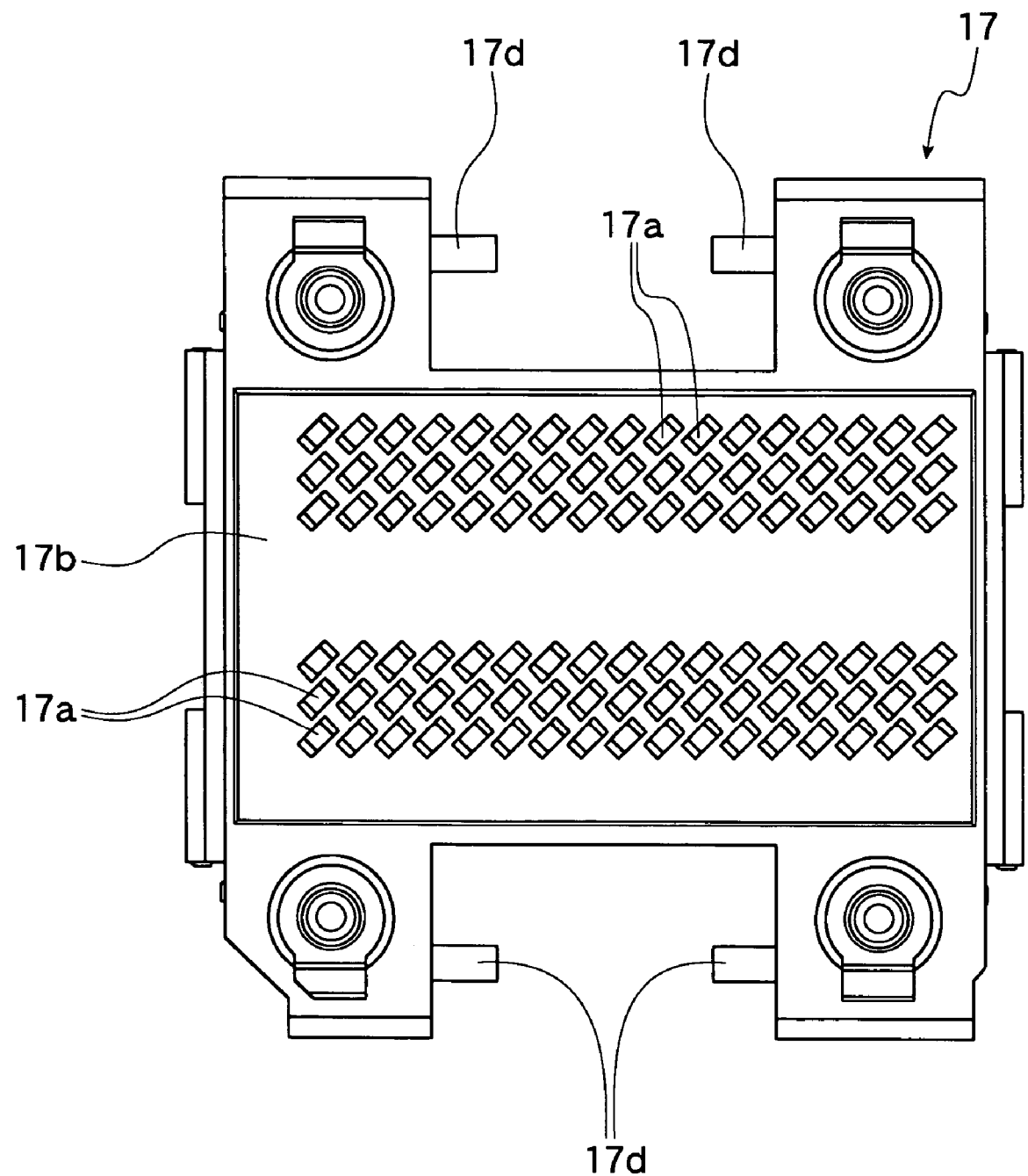
FIG. 11 is a bottom view of the movable member of FIG. 9.

In the meantime, the movable member 17 has, as shown in FIGS. 9 to 11, a movable member body 17b in form of a horizontal plate to which a number of insertion holes 17a are formed and projection pieces 17c projecting upward from end edge portions of the movable member body 17b. The movable member 17 is urged upward by a coil spring 25, and the upward movement of the movable member 17 is restricted by the engagement of the engaging portion 14b projecting from the base member 14 as shown in FIG. 2.

Further, as shown in FIG. 2, a frame-shaped guide member 19 is disposed inside each projection piece 17c above the movable member 17. The guide member 19 is formed with a support piece 19a supporting a peripheral edge portion of the package body 12a, and a guide 19b is disposed to the peripheral edge portion of the support piece 19a so as to project upward. According to the location of such guides 19b, the IC package 12 is guided when accommodated to the IC socket. The guide member 19 is also provided with an engaging portion 19c projecting downward as shown in FIG. 2, and by engaging this engaging piece 19c with the base member 14, the guide member 19 is secured. The guide member 19 is formed with an opening 19d through which a latch member 28 is inserted or withdrawn, as mentioned hereinlater.

Figure 5:
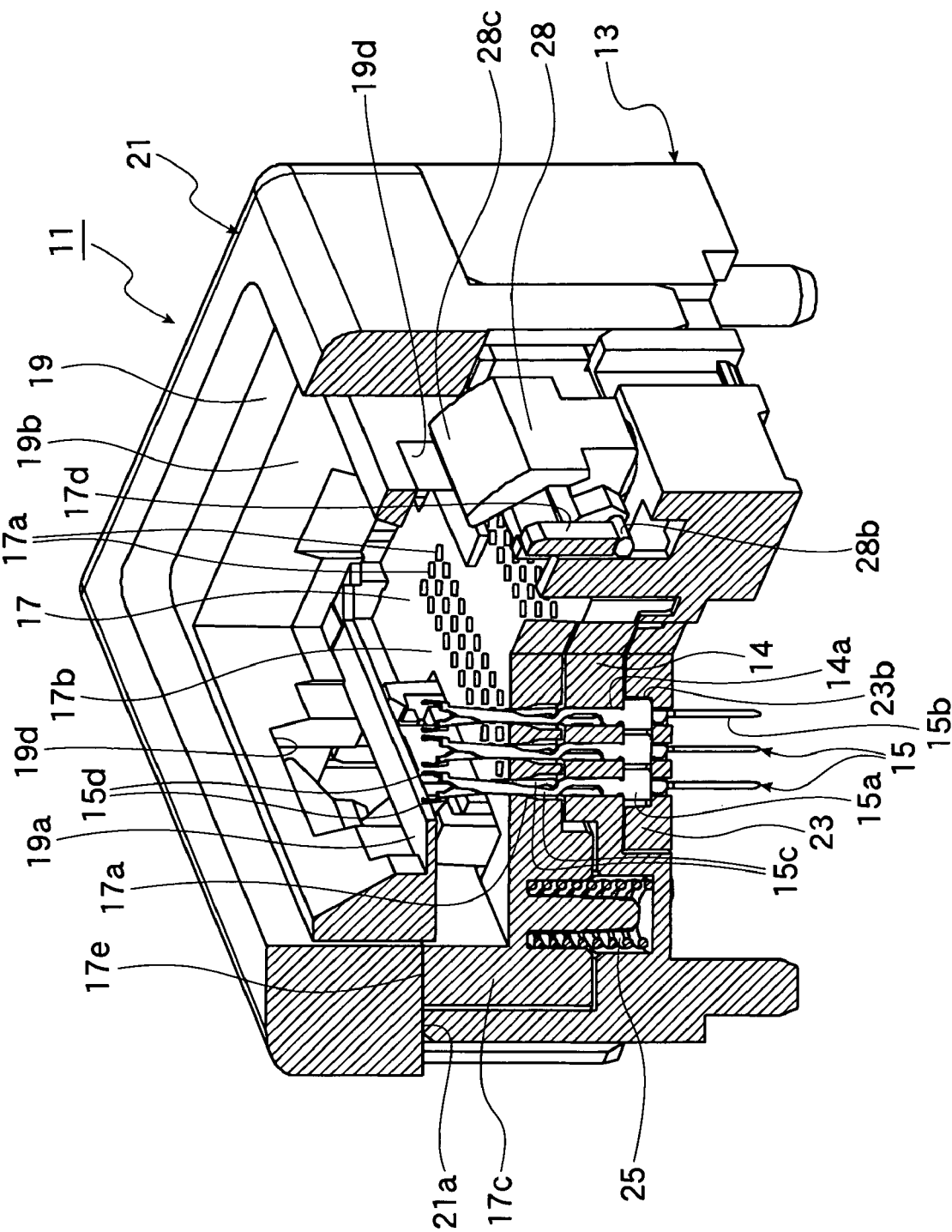
FIG. 5 is a perspective view, partially in section, of the IC socket of the first embodiment, in which a movable member takes a lowermost position thereof.
Figure 12:
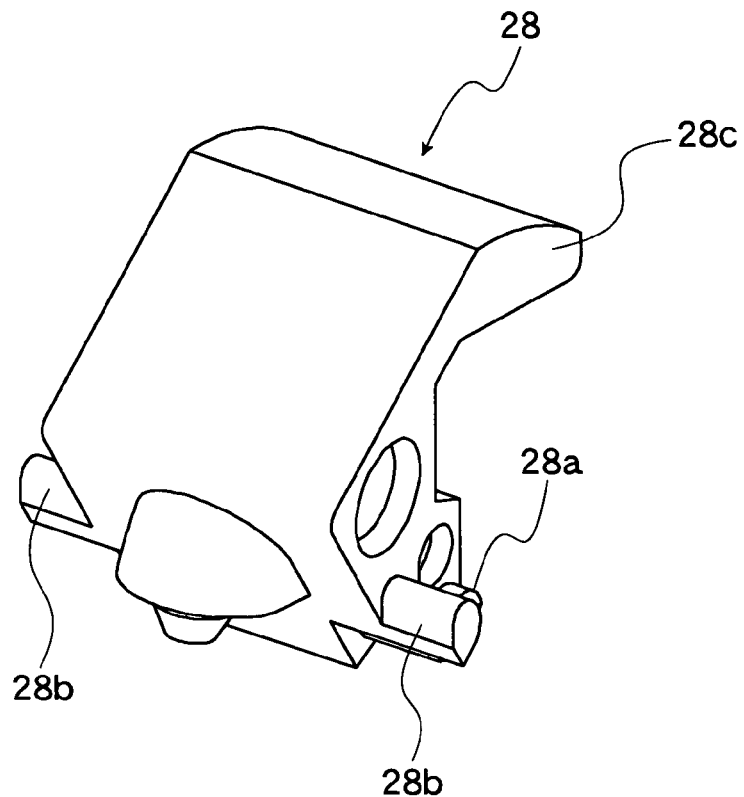
FIG. 12 is a perspective view of a latch member, viewed from an obliquely upper position, according to the first embodiment.
Figure 13:
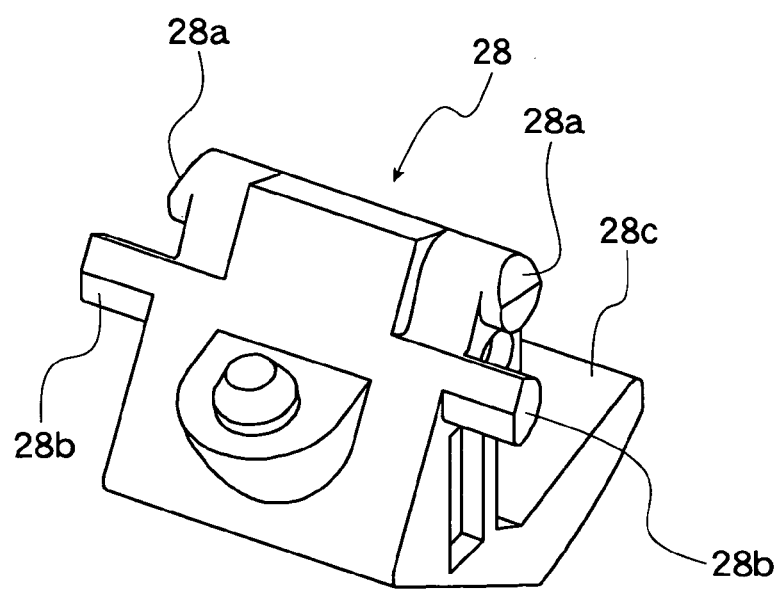
FIG. 13 is a perspective view of a latch member, viewed from an obliquely lower position, according to the first embodiment.
Figure 14:
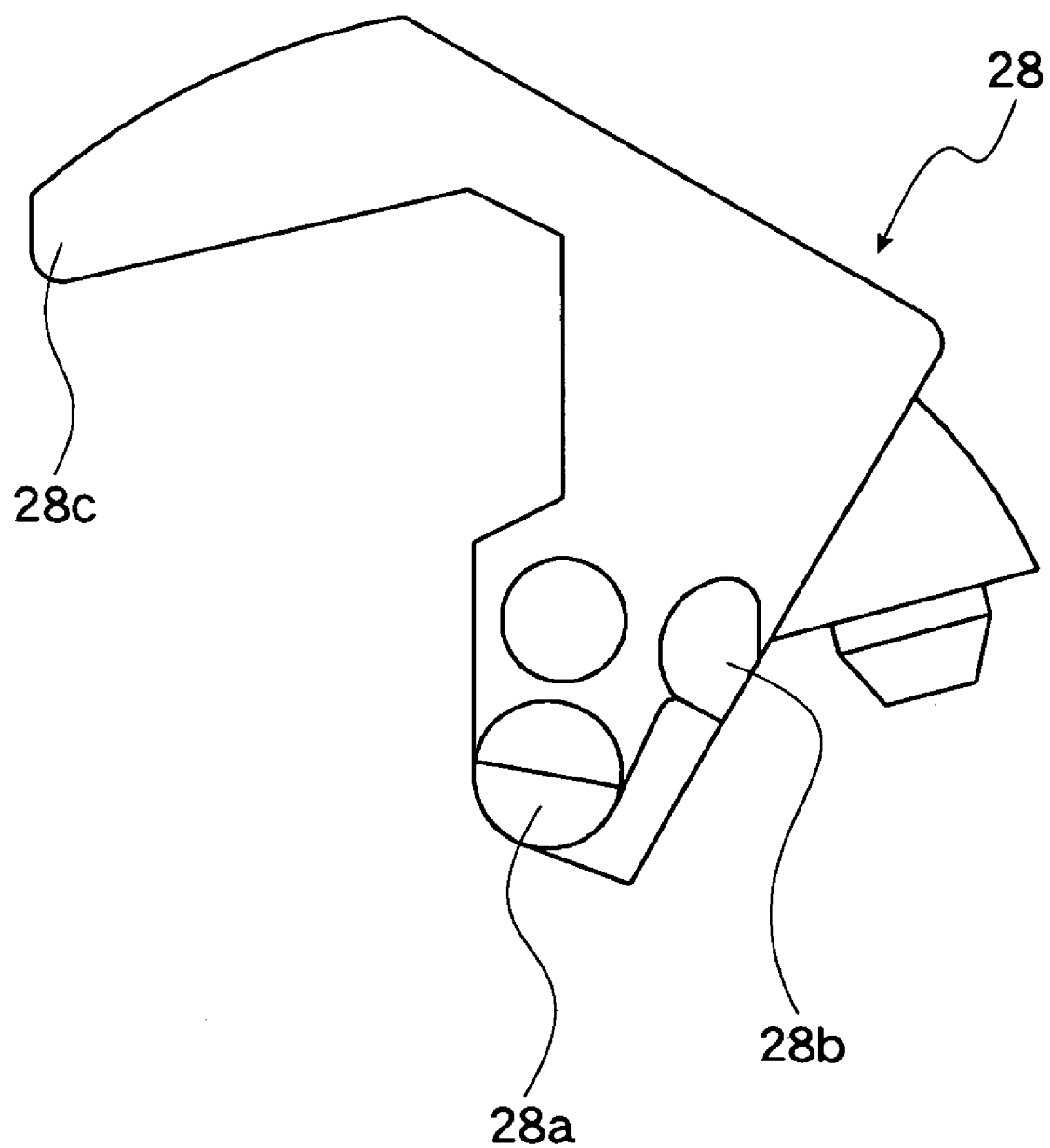
FIG. 14 is a side view of the latch member.
Figure 15:
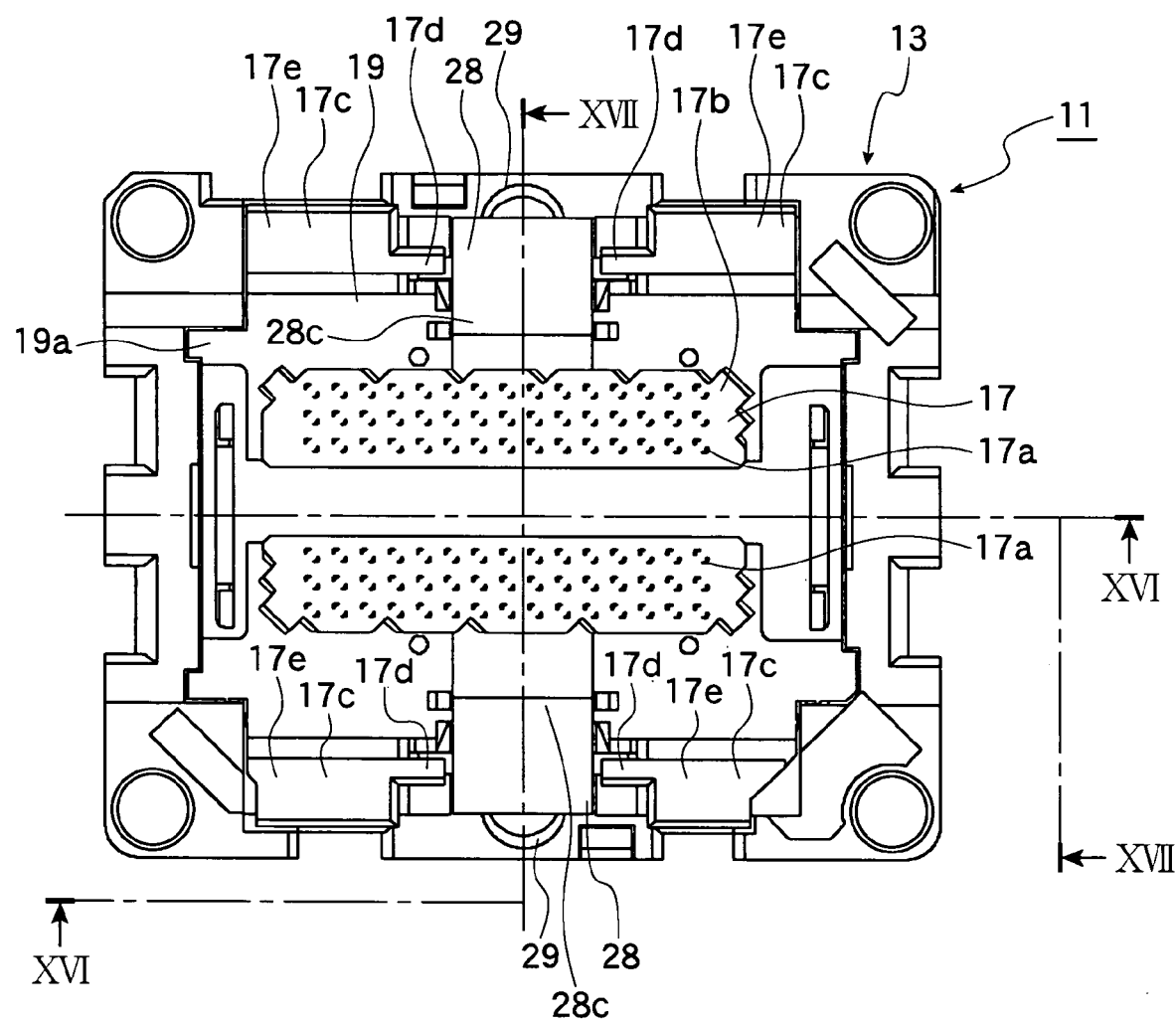
FIG. 15 is a plan view of an IC socket according to a second embodiment of the present invention.
Figure 16:
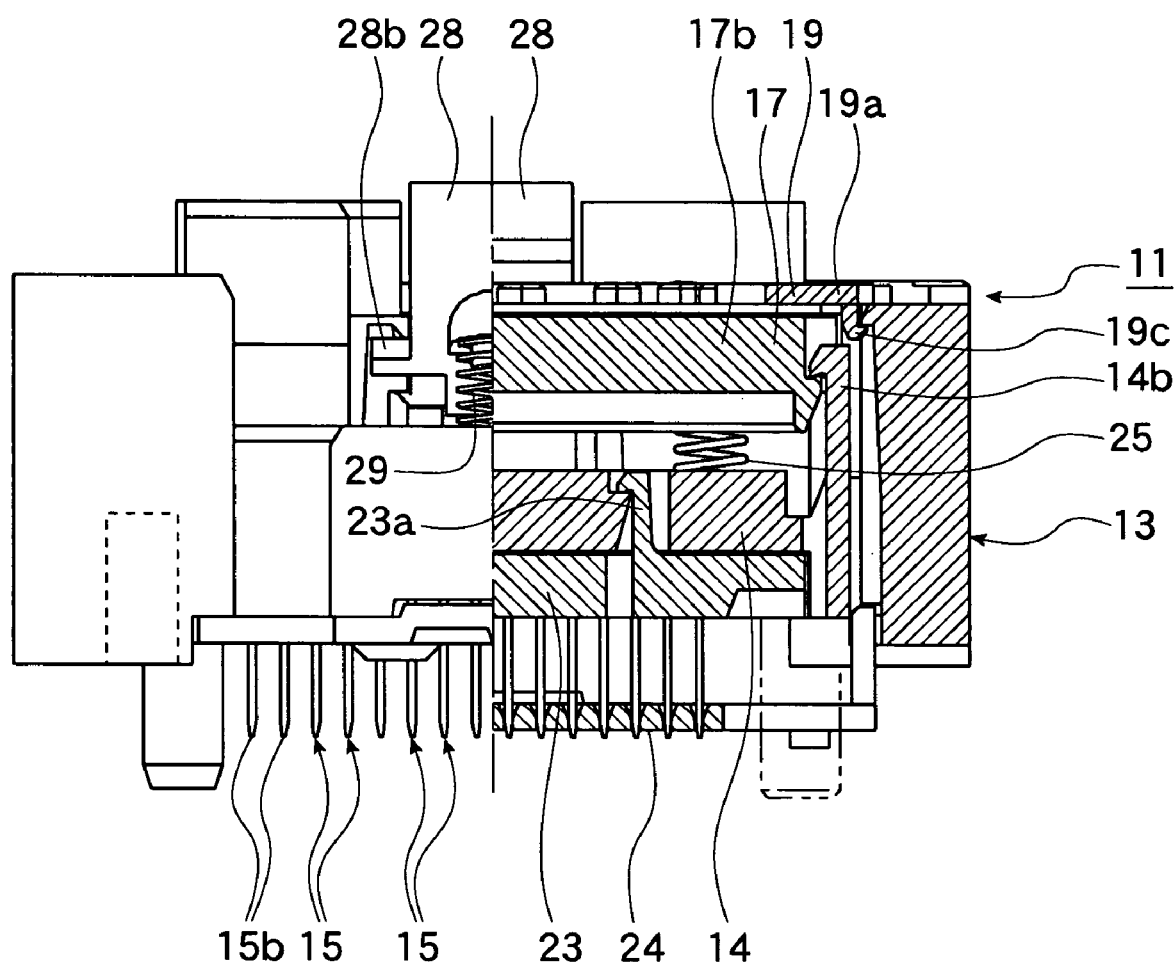
FIG. 16 is a sectional view taken along the line XVI—XVI in FIG. 15.
Figure 17:
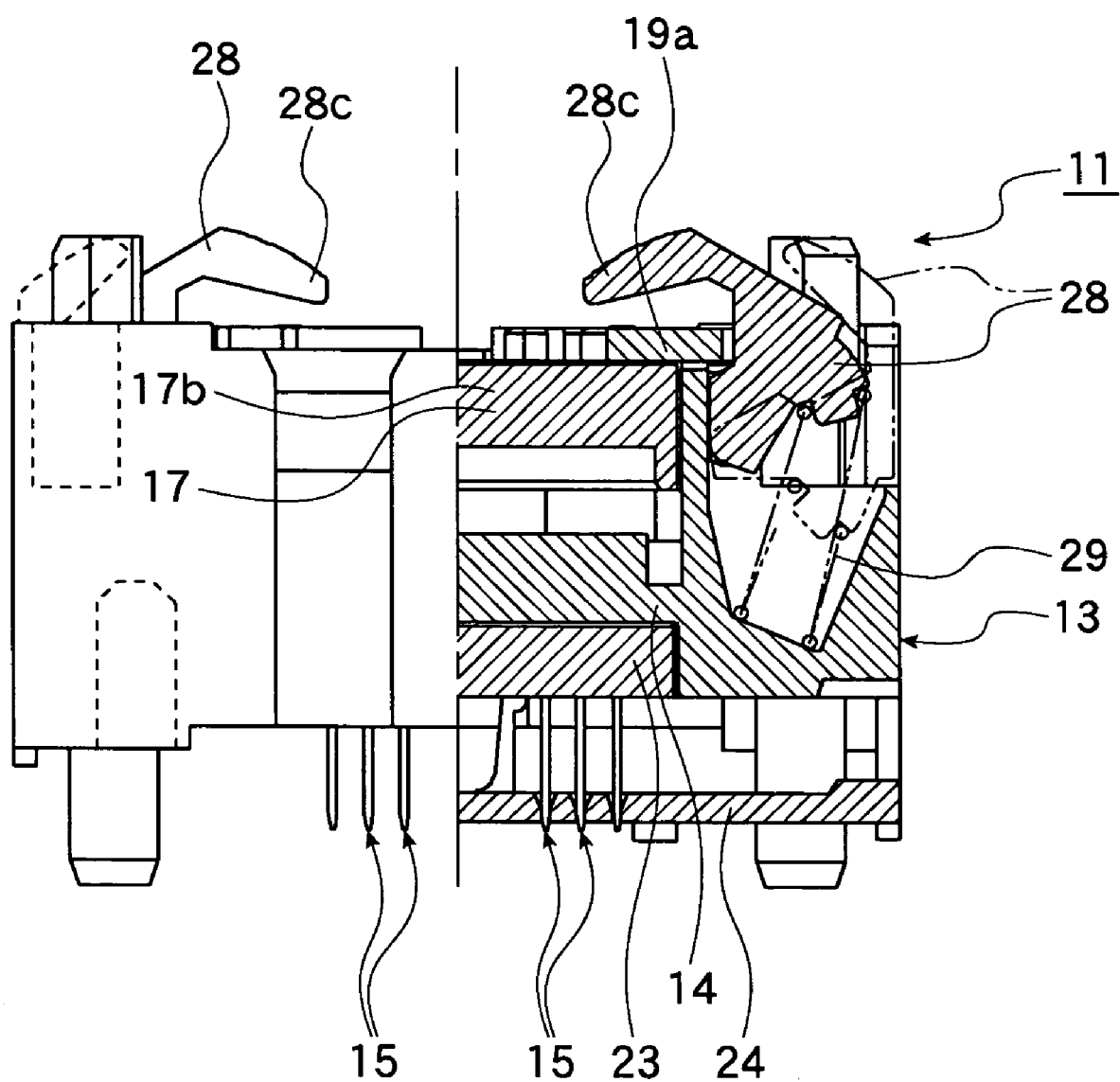
FIG. 17 is a sectional view taken along the line XVII—XVII in FIG. 15.
Figure 18:
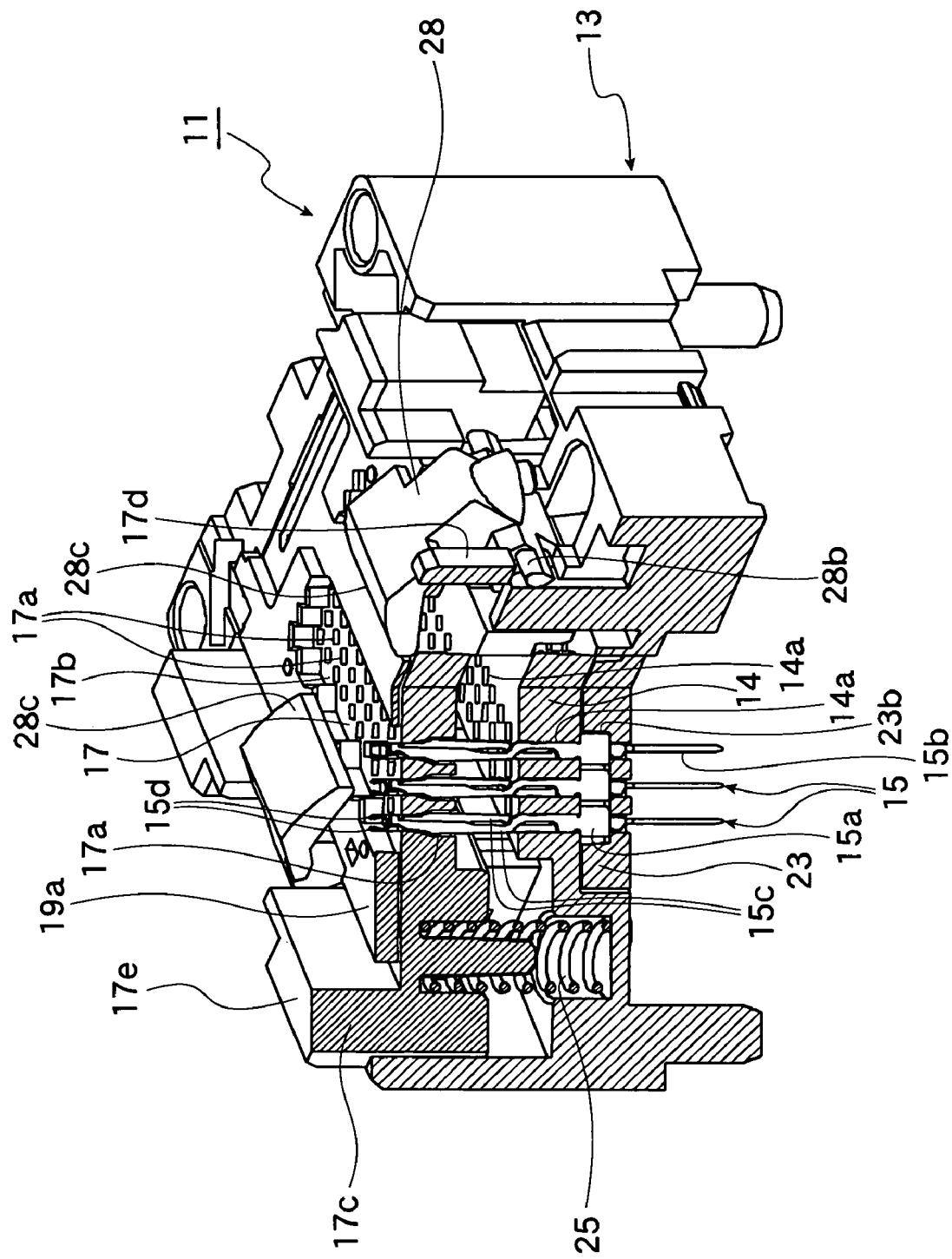
FIG. 18 is a perspective view, partially in section, of the IC socket of the second embodiment, in which a movable member takes an uppermost position thereof.
Figure 19:
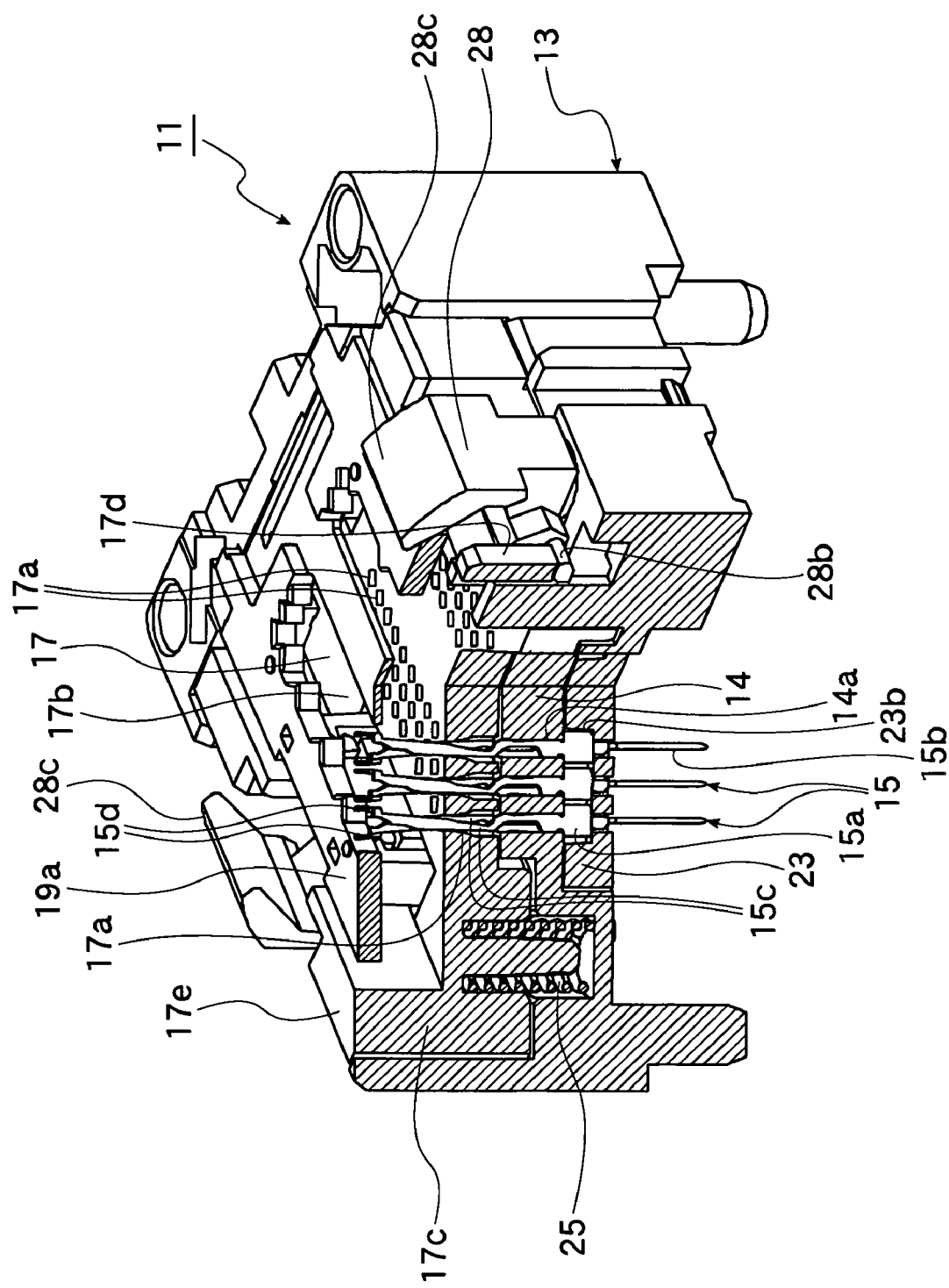
FIG. 19 is a perspective view, partially in section, of the IC socket of the second embodiment, in which a movable member takes a lowermost position thereof.

The latch member 28 includes, as shown in FIGS. 12 to 14, a rotation shaft (pivot) 28a, to which the socket body 13 is provided to be rotatable (pivotal). As also shown in FIG. 5, the latch member 28 is formed, at side portions thereof, with a pair of portions 28b to be pressed (pressed portions 28b) by a pressing portion 17d of the movable member 17. Furthermore, the latch member 28 is, as shown in FIG. 3, urged by a spring 29 in a direction to be closed, and a pressing portion 28c formed to the front end portion of the latch member 28 abuts against the upper surface of the peripheral edge portion of the IC package 12 to press down the IC package 12.

When the movable member 17 is moved downward, the pressing portion 17d of the movable member 17 presses the pressed portion 28b of the latch member 28, and then, the latch member 28 is rotated to be opened from a first position shown with solid line in FIG. 3 to a second position shown with a two-dot chain line in FIG. 3. Then, the pressing portion 28c of the latch member 28 is retired from the accommodation and take-out line of the IC package 12.

The operation member 21 has a square frame shape, which is arranged on the periphery of the guide member 19 and the socket body 13 to be movable in the vertical direction. The operation member 21 has a pressing surface 21a pressing a surface 17e to be pressed (pressed surface 17e) formed on the upper surface of the projection piece 17c of the movable member 17, and when pressed, the movable member 17 is moved downward against the urging force of the coil spring 25.

The IC socket 11 having the structure mentioned above will be usable in a manner described hereunder.

A printed circuit board on which a number of IC sockets 11 are arranged is preliminarily prepared, and then, in order to set the IC packages 12 respectively to the IC sockets 11 by using an automatic machine, the operation member 21 is first pressed downward.

According to this lowering motion of the operation member 21, the movable member 17 is pressed downward and then lowered against the urging force of the coil spring 25.

The lowering motion of the movable member 17 opens both the contact portions 15d of each of the contact pins 15 and, hence, opens the latch member 28.

That is, when the movable member 17 is lowered, the portion 28b to be pressed of the latch member 28 is pressed by the pressing portion 17d, and against the urging force of the spring 29, the latch member 28 is rotated to the position shown with the two-dots-chain line in FIG. 3, and accordingly, the pressing portion 28c of the latch member 28 is retired from the accommodation or take-out line of the IC package 12.

Further, when the movable member 17 is lowered from the position shown in FIG. 6 to the position shown in FIG. 7, the bulged portions 15h of the elastic pieces 15c of each contact pin 15 are pressed against the peripheral wall portions of the insertion hole 17a of the movable member 17, and hence, the contact portions 15d of each contact pin 15 are opened, i.e., separated from each other.

In the state mentioned above, the IC package 12 is guided by the guides 19b and accommodated on the predetermined portion on the support pieces 19a, and the solder balls 12b of the IC package 12 are inserted, in non-contact state, between the opened pair of contact portions 15d of the contact pins 15, respectively, as shown in FIG. 7.

Thereafter, when the downward pressing force of the operation member 21 is released, the movable member 17 moves upward by the urging force of the coil spring 25, and then, the latch member 28 is rotated to the first position in the closing direction by the urging force of the spring 29. Thus, the floating of the IC package 12 can be prevented by the pressing of the latch member 28.

Moreover, when the movable member 17 is moved upward, the pressing force to the slidable portions 15g of the contact pin 15 is released, and is then moved in the direction along which the paired contact portions 15d are closed (that is, the distance therebetween is narrowed) from the state shown in FIG. 7, thereby holding the solder ball 12b between both contact portions 15d.

Therefore, the respective solder balls 12b of the IC package 12 and the printed circuit board are electrically connected through the contact pins 15, i.e., through the deformation of the contact pieces of the contact pins.

On the other hand, when it is required to dismount the IC package 12 from the state mounted to the socket, the movable member 17 is first lowered by the operation of the operation member 21 to thereby rotate the latch member 28 to the second position, and then, the paired contact portions 15d of the contact pin 15 are separated from the solder ball 12b, so that when the solder ball 12b is pulled out of the clamped state between the contact portions 15d, the solder ball 12b can be easily pulled out with weak force, thus easily removing the IC package 12.

According to the invention of the structure mentioned above, by vertically moving the movable member 17, the opening or closing operation of the contact pin 15 and the rotation of the latch member 28 can be directly done.

Accordingly, it becomes possible to press the movable member 17 by a head, which may be disposed on the package insertion/take-out device side, without utilizing the operation member 21, thus reducing the number of members or parts.

In addition, the open/close operation of the contact pins 15 and the rotating operation of the latch member 28 are performed by the movable member 17, so that an error which may be caused at a time of molding or assembling could be significantly reduced from causing, and moreover, the timings of the open/close operation and the rotating operation could be made coincident with each other.

Furthermore, according to the present invention, since the contact pin 15 is inserted into the insertion hole 14$a$ of the base member 14 of the socket body 13 from the lower side toward the upper side, the base portion 15$a$ of the contact pin 15 abuts against the lower surface of the base member 14 to thereby restrict the upper limit of the contact portions 15$d$ of the contact pin 15. Accordingly, the contact portion 15$d$ do not project upward over the predetermined position, so that the solder ball 12$b$ is less damaged.

Moreover, since the contact pins 15 are inserted at once into the insertion holes 14$a$ and 17$a$ from the lower side thereof in a state of the movable member 17 being arranged on the base member 14, the contact pins 15 and associated members or parts can be easily operated.

Still furthermore, according to the described embodiment, the bottom plate 23 is disposed on the lower side of the base portions 15$a$ of the contact pins 15 so as to prevent the base portions 15$a$ from moving downward, so that the contact pins 15 can be maintained in their predetermined height level.

[Second Embodiment]

FIGS. 15 to 19 represent the second embodiment of the present invention.

The second embodiment differs from the first embodiment in that an operation member 21 such that in the first embodiment is not located, and the guide member only includes the support piece 19$a$ and does not include the guide 19$b$.

In such structure of the second embodiment, the pressed surface 17$e$ (horizontal surface) formed on the upper surface of the projection piece 17$c$ of the movable member 17 is directly pressed by a head disposed on the package insertion/take-out device side, not shown.

Accordingly, with no use of the operation member 21, the number of constitutional members or parts can be reduced, and in addition, the surface 17$e$ to be pressed has a horizontal surface perpendicular to the moving direction (vertical direction), so that the head side can be simply constructed, thus improving the strength thereof, and furthermore, there is not adopted a sliding structure, any wearing can be positively prevented, thereby improving the durability of the IC socket as well as such head, thus being effective.

The structures of the second embodiment other than the above different structure are substantially the same as those of the first embodiment, so that the details thereof are omitted herein.

Further, it is to be noted that the present invention is not limited to the described embodiments and many other changes and modifications may be made without departing from the scopes of the appended claims.

For example, in the described embodiments, although the present invention is utilized as the IC socket 11 for as a socket for electrical parts, the present invention is not limited thereto and may be applied to another device.

Moreover, although the present invention is applied to the IC socket 11 for the BGA type IC package 12, it may be applied to an IC socket for a PGA (Pin Grid Array) type IC package. Furthermore, the latch member of the present invention may have a structure or shape other than that mentioned above in the described embodiments and more than two, such as four, latch members may be located.

What is claimed is:

1. A socket for an electrical part comprising:
   a socket body to which an electrical part is accommodated, the socket body having a base portion to which a plurality of contact pins, having elastic pieces, which are contacted to or separated from terminals of the electrical part, are arranged;
   a movable member disposed to the socket body above the base portion thereof to be vertically movable and comprising a pressing portion, deformation of the elastic pieces of the contact pins inserted into an insertion hole formed to the movable member being performed in accordance with the vertical movement of the movable member, according to the deformation thereof, contact portions formed to the contact pins being opened or closed; and
   a latch member provided for the socket body so as to press the electrical part accommodated to the socket body, the latch member being disposed to be movable between a first position at which the electrical part is pressed and a second position at which the latch member is retired from a line along which the electrical part is accommodated or taken out, the latch member being pressed and moved by the pressing portion of the movable member to the second position when the movable member is lowered.

2. The socket for an electrical part according to claim 1, wherein said latch member is rotatable around a rotation shaft disposed to the socket body and formed with a portion to be pressed by the pressing portion of the movable member.

3. The socket for an electrical part according to claim 1, wherein the latch member has a pressing portion at a front end portion thereof to press an upper surface of the electrical part.

4. The socket for an electrical part according to claim 1, wherein the socket further comprises an operation member disposed to the socket body so as to vertically move the movable member.

5. The socket for an electrical part according to claim 4, wherein the movable member further comprises a projection piece having an upper surface.

6. The socket for an electrical part according to claim 5, wherein the operation member comprises a pressing surface pressing the upper surface of the projection piece, wherein when the upper surface is pressed by the pressing surface, the movable member is moved downward against an urging force of a spring.

7. The socket for an electrical part according to claim 3, wherein the latch member is urged by a spring in a direction to press the upper surface of the electrical part with the pressing portion.

8. A socket comprising:
   a socket body to accommodate an electrical part therein, and comprising a base portion to which contact pins are arranged, the contact pins contacting and separating from terminals of the electrical part;
   a movable member disposed to the socket body above the base portion, to be vertically movable and comprising a pressing portion, deformation of elastic pieces of the contact pins inserted into an insertion hole formed to the movable member; and a latch being pressed and moved by the pressing portion of the movable member between a first position at which the electrical part is pressed and a second position at which the latch is retired from a line along which the electrical part is accommodated, the latch being moved to the second position when the movable member is lowered.

* * * * *